US012625277B1

(12) United States Patent
Bench et al.

(10) Patent No.: US 12,625,277 B1
(45) Date of Patent: May 12, 2026

(54) ANTENNA SYSTEMS FOR CIRCULARLY POLARIZED RADIO SIGNALS

(71) Applicant: SeeScan, Inc., San Diego, CA (US)

(72) Inventors: Stephanie M. Bench, Sandersville, GA (US); Mark S. Olsson, La Jolla, CA (US); Ray Merewether, La Jolla, CA (US)

(73) Assignee: SeeScan, Inc., San Diego, CA (US)

( * ) Notice: Subject to any disclaimer, the term of this patent is extended or adjusted under 35 U.S.C. 154(b) by 114 days.

(21) Appl. No.: 18/443,123

(22) Filed: Feb. 15, 2024

Related U.S. Application Data

(63) Continuation of application No. 17/020,487, filed on Sep. 14, 2020, now Pat. No. 11,921,225.

(60) Provisional application No. 62/899,296, filed on Sep. 12, 2019.

(51) Int. Cl.
| | |
|---|---|
| *G01S 19/32* | (2010.01) |
| *G01S 19/37* | (2010.01) |
| *H01Q 1/48* | (2006.01) |
| *H01Q 21/24* | (2006.01) |
| *H01Q 23/00* | (2006.01) |
| *H03F 3/19* | (2006.01) |
| *H01Q 1/42* | (2006.01) |

(52) U.S. Cl.
CPC .............. *G01S 19/32* (2013.01); *G01S 19/37* (2013.01); *H01Q 1/48* (2013.01); *H01Q 21/24* (2013.01); *H01Q 23/00* (2013.01); *H03F 3/19* (2013.01); *H01Q 1/42* (2013.01); *H03F 2200/294* (2013.01); *H03F 2200/451* (2013.01)

(58) Field of Classification Search
USPC ........................................................ 343/797
See application file for complete search history.

(56) References Cited

U.S. PATENT DOCUMENTS

| | | | | |
|---|---|---|---|---|
| 3,087,159 A | * | 4/1963 | Gozinsky ................. | H01Q 9/43 |
| | | | | 343/895 |
| 3,811,127 A | * | 5/1974 | Griffee ................... | H01Q 21/26 |
| | | | | 343/705 |
| 4,295,144 A | * | 10/1981 | Matta ..................... | H01Q 1/362 |
| | | | | 343/895 |
| 5,138,331 A | * | 8/1992 | Josypenko ............. | H01Q 11/08 |
| | | | | 343/895 |
| 5,179,386 A | * | 1/1993 | Rudish .................... | H01Q 3/40 |
| | | | | 342/373 |

(Continued)

OTHER PUBLICATIONS

P. Misra et al., "Global Positioning System: Signals, Measurements, and Performance"; pp. 76-77; Revised second edition; Ganga-Jamuna Press; Lincoln, Massachusetts, USA; copyright 2012. (Year: 2012).*

*Primary Examiner* — Bernarr E Gregory
(74) *Attorney, Agent, or Firm* — Steven C. Tietsworth, Esq.; Michael J. Pennington, Esq.

(57) ABSTRACT

Antenna systems for receiving right and left hand circularly polarized signals are disclosed. An antenna system embodiment includes a top printed circuit board (PCB), a ground plane, and an antenna array including four conductive antenna elements positioned at relative zero, 90, 180, and 270 degree increments radially about a shared center point on the PCB, with each antenna element sloping upward in a left-handed direction from the ground plane towards the top PCB and connected to the ground plane and top PCB.

18 Claims, 15 Drawing Sheets

(56)                    References Cited

U.S. PATENT DOCUMENTS

| | | | | |
|---|---|---|---|---|
| 5,557,524 | A * | 9/1996 | Maki ..................... | G01S 19/33 |
| | | | | 701/32.4 |
| 5,923,287 | A * | 7/1999 | Lennen .................. | G01S 19/36 |
| | | | | 342/357.73 |
| 6,075,501 | A * | 6/2000 | Kuramoto ............. | H01Q 11/08 |
| | | | | 343/895 |
| 6,081,691 | A * | 6/2000 | Renard .................. | G01S 19/36 |
| | | | | 342/357.73 |
| 6,295,035 | B1 * | 9/2001 | Holzheimer ............. | G01S 3/02 |
| | | | | 343/797 |
| 6,987,489 | B2 * | 1/2006 | Melconian ............... | G01S 3/48 |
| | | | | 343/781 P |
| 9,484,634 | B1 * | 11/2016 | Behroozi ................ | H01Q 1/28 |
| 11,921,225 | B1 * | 3/2024 | Bench .................... | G01S 19/32 |
| 2004/0070545 | A1 * | 4/2004 | Ikeda ..................... | H01Q 9/32 |
| | | | | 343/756 |
| 2006/0012525 | A1 * | 1/2006 | Eide ...................... | H01Q 21/24 |
| | | | | 343/700 MS |
| 2007/0139293 | A1 * | 6/2007 | Hasegawa ............. | H01Q 11/08 |
| | | | | 343/895 |
| 2008/0074339 | A1 * | 3/2008 | Lee ......................... | H01Q 9/26 |
| | | | | 343/803 |
| 2010/0117914 | A1 * | 5/2010 | Feller .................... | H01Q 21/26 |
| | | | | 343/820 |
| 2010/0277389 | A1 * | 11/2010 | Kikin ..................... | H01Q 21/24 |
| | | | | 343/843 |
| 2013/0190708 | A1 * | 7/2013 | Rodsten ................ | A61G 9/006 |
| | | | | 604/349 |
| 2015/0263434 | A1 * | 9/2015 | Bench ..................... | H01Q 5/48 |
| | | | | 343/879 |
| 2017/0125918 | A1 * | 5/2017 | Howard ................ | H01Q 21/06 |
| 2018/0198194 | A1 * | 7/2018 | Hyjazie ................ | H01Q 11/08 |

* cited by examiner

300

350

204

200

202

180°

270°

90°

0°

206

300

350

204

200

202

180°

270°

90°

0°

206

*900*

910b

90°

*930a*

910c

920

180°

0°

910a

910d

920

270°

*930b*

Combined output signal

ANTENNA SYSTEMS FOR CIRCULARLY POLARIZED RADIO SIGNALS

CROSS-REFERENCE TO RELATED APPLICATIONS

This application claims priority under 35 U.S.C. § 119 (e) to U.S. Provisional Patent Application Ser. No. 62/899,296, entitled ANTENNA SYSTEMS FOR CIRCULARLY POLARIZED RADIO SIGNALS, filed on Sep. 12, 2019, the content of which is hereby incorporated by reference herein in its entirety for all purposes. This application is a continuation of U.S. patent application Ser. No. 17/020,487, filed Sep. 14, 2020, now U.S. Pat. No. 11,921,225.

FIELD

This disclosure relates generally to antennas and antenna systems for receiving circularly polarized signals. More specifically, but not exclusively, this disclosure relates to antennas and antenna systems for receiving circularly polarized signals for satellite navigation systems.

BACKGROUND

In wireless telecommunications, an unobstructed clear path between a transmitter and receiver is generally favorable to ensure communication of radio signals. In many instances, an unobstructed clear path is not possible or practical, thus causing transmitted signals to either fail to reach the receiver due to attenuation or, in some cases, reflect or refract off surfaces prior to reaching the receiver. Multipath signals resulting from such reflecting or refracting may introduce undesirable errors at the receiver due to changes in the signal's phase, amplitude, timing delays, and the like.

Wherein the transmitted signal is circularly polarized, a multipath circularly polarized signal may be identified by a change in handedness. For instance, global positioning systems (GPS) as well as other global navigation satellite systems (GNSS) may include a network of satellites configured to all transmit right-hand circularly polarized (RHCP) signals. In instances where the RHCP signals reflect or refract off surfaces, a change in handedness may occur, resulting in left-hand circularly polarized (LHCP) signals which may be subject to various multipath errors. These multipath errors may dramatically impact performance and accuracy.

There are various antennas and associated systems known in the art that attempt to correct for such multipath errors. For example, antennas and associated systems configured to receive and process circularly polarized signals may generally address multipath errors by attempting to cancel or otherwise reduce LHCP signals. However, existing antennas and systems result in suboptimal performance of associated GNSS or other devices.

Accordingly, there is a need in the art to address these and other problems in the field of reception of GNSS and other circularly polarized radio signals, as well as other radio transmission and reception problems.

SUMMARY

This disclosure relates generally to antennas and antenna systems for receiving circularly polarized signals. More specifically, but not exclusively, this disclosure relates to antennas and antenna systems for receiving circularly polarized signals from navigation satellites.

In one aspect, the present disclosure includes an antenna system having a top printed circuit board (PCB) and a ground plane with an antenna array comprising a series of conductive antenna elements disposed in between the top PCB and ground plane. The antenna elements may be positioned at relative zero, 90, 180, and 270 degree increments radially about a shared center point. Each antenna element may slope upward in a left-handed direction connecting from the ground plane and further slope toward the top PCB.

In another aspect, the present disclosure includes an antenna system comprising an antenna array having multiple antenna elements generating input signals successively 90 degrees out of phase such that the input signals have a relative phase of zero, 90, 180, and 270 degrees. The antenna system further comprises an impedance matching network coupled to the antenna array such that the impedance of the input signals at each antenna element matches that of the other antenna elements. The antenna system further comprises a pair of 90 degree phase shifting elements wherein each phase shifting element is coupled to a pair of antenna elements in the antenna array to receive their associated input signals, shift the phase on one signal 90 degrees to match that of its paired antenna element's signal, and output a combined signal 180 degrees out of phase to that of the output signal of the other 90 degree phase shifting element. A low noise amplifier may be coupled to each 90 degree phase shifting element to amplify the combined output signal and isolate impedance differences in the 180 degree out of phase output signals. The antenna system further comprises a first transformer element and second transformer element. The first transformer element comprising a first inductor coupled to both low noise amplifiers that outputs right-hand circularly polarized signals at a second inductor. The second transformer element comprising a first inductor and second inductor. The first inductor of the second transformer element may be center tapped off the first inductor of the first transformer element. The second transformer element may take common mode signals and output left-hand circularly polarized signals at a second inductor.

In another aspect, the present disclosure includes an antenna system comprising an antenna array having multiple antenna elements generating input signals successively 90 degrees out of phase such that the input signals have a relative phase of zero, 90, 180, and 270 degrees. The antenna system further comprises a transmission line connecting the antenna element at zero degrees to the antenna element at 90 degrees and another transmission line connecting the antenna element at 180 degrees to the antenna element at 270 degrees. Each transmission line may have a length that may generate a 90 degree phase shift thus aligning the phase of the input signal at zero degrees to the phase of the input signal at 90 degrees and aligning the phase of the input signal at 180 degrees to the phase of the input signal at 270 degrees. The antenna system further comprises a first transformer and a second transformer. The first transformer may receive signal from the 90 degree antenna element and output a signal having no phase adjustment. The second transformer may receive signal from the 270 degree antenna element and output a signal having a 180 degree phase adjustment such that the phase of the output signal of the second transformer may align with the phase of the first transformer output. The first and second transformers may couple together such that the outputs of each transformer may be phase aligned and a combined output signal may be generated. The combined output signal may be a RHCP signal as LHCP signals may be canceled.

In another aspect, the present disclosure includes a multi-band navigation signal antenna system comprising a single antenna supplying signal to a plurality of GNSS receiver modules.

Various additional aspects, features, and functionality are further described below in conjunction with the appended Drawings.

BRIEF DESCRIPTION OF THE DRAWINGS

The present disclosure may be more fully appreciated in connection with the following detailed description taken in conjunction with the accompanying drawings, wherein.

DETAILED DESCRIPTION OF EMBODIMENTS

Figure 1:
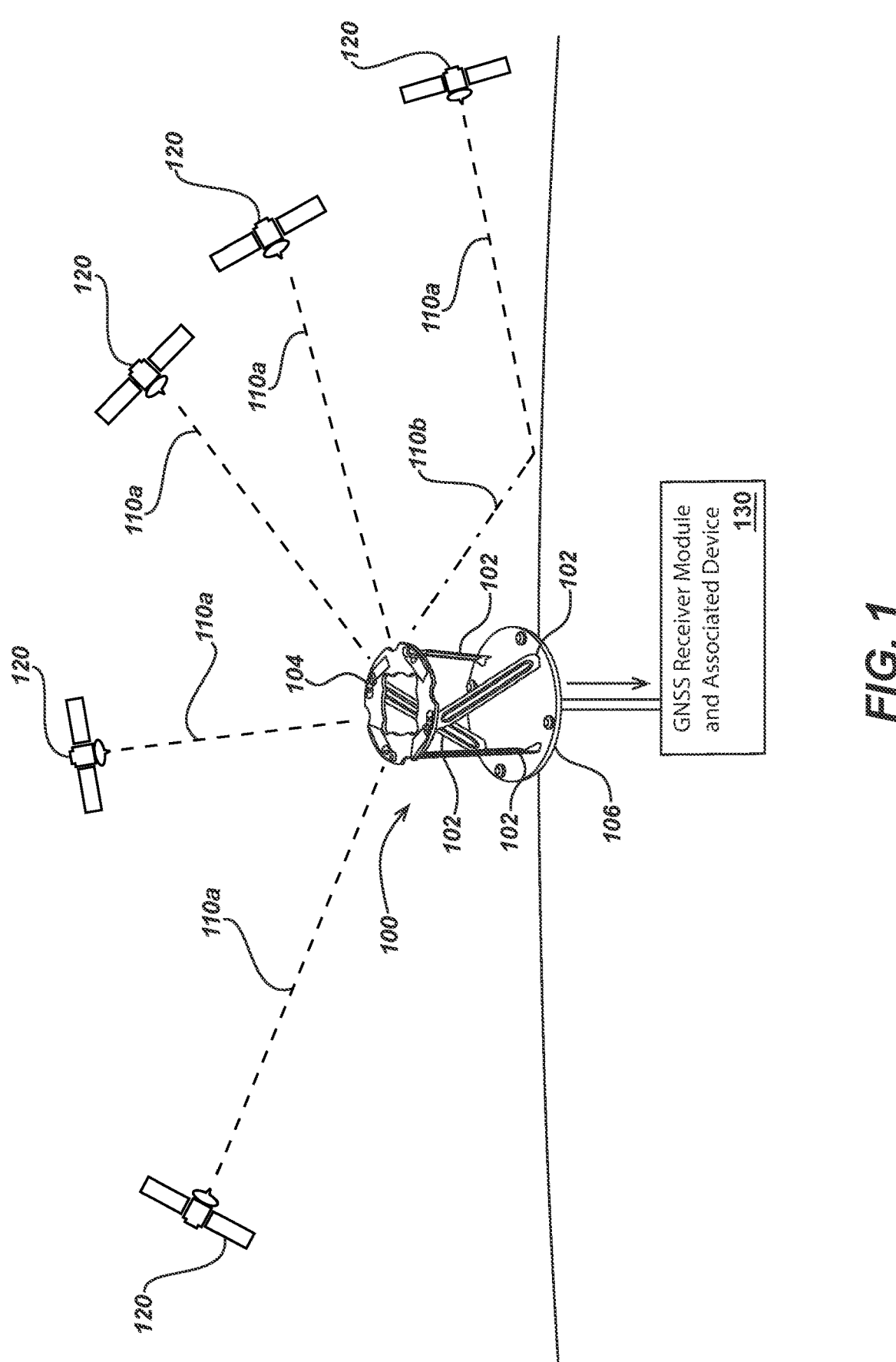
FIG. 1 is an illustration of an antenna system embodiment for use with a GNSS receiver.

This disclosure relates generally to antennas and antenna systems for receiving circularly polarized signals. More specifically, but not exclusively, this disclosure relates to antennas and antenna systems for receiving circularly polarized signals from navigation satellites such as GPS or other GNSS systems.

In one aspect, the present disclosure is directed to an antenna system having a top PCB and a ground plane with an antenna array comprising a series of conductive antenna elements disposed in between the top PCB and ground plane. The antenna elements may be positioned at relative zero, 90, 180, and 270 degree increments radially about a shared center point. Each antenna element may slope upward in a left-handed direction connecting from the ground plane and further slope toward the top PCB. In such antenna system embodiments, beam width control, band-width, and left-hand and right hand signal ratio are adjusted by the slope and length of the antenna elements and dimensions of the ground plane. Some embodiments may be configured for GNSS receivers that may cover a frequency range spanning the lower L-band and upper L-band GNSS navigational frequencies. In some antenna systems, a support element may be used to separate and hold the top PCB and ground plane apart at a predetermined distance. Some antenna systems in keeping with the present disclosure may further include an additional top connector element to electrically connect antenna elements at zero and 180 degrees and the antenna elements at 90 and 270 degrees to the top PCB.

In another aspect, the present disclosure is directed to an antenna system comprising an antenna array having multiple antenna elements generating input signals successively 90 degrees out of phase such that the input signals have a relative phase of zero, 90, 180, and 270 degrees. The antenna system further comprises an impedance matching network coupled to the antenna array such that the impedance of the input signals at each antenna element matches that of the other antenna elements. The antenna system further comprises a pair of 90 degree phase shifting elements wherein each phase shifting element is coupled to a pair of antenna elements in the antenna array to receive their associated input signals, shift the phase on one signal 90 degrees to match that of its paired antenna element's signal, and output a combined signal 180 degrees out of phase to that of the output signal of the other 90 degree phase shifting element. A low noise amplifier may be coupled to each 90 degree phase shifting element to amplify the combined output signal and isolate impedance differences in the 180 degree out of phase output signals. The antenna system further comprises a first transformer element and second transformer element. The first transformer element comprising a first inductor and second inductor wherein the first inductor is coupled to both low noise amplifiers and outputs right-hand circularly polarized signals at the second inductor. The second transformer element comprising a first inductor and second inductor. The first inductor of the second transformer element may be center tapped off the first inductor of the first transformer element and take common mode signals and output left-hand circularly polarized signals at the second inductor. In some embodiments, such an antenna system may include the prior antenna system configurations described herein having antenna elements at zero, 90, 180, and 270 degree positions.

In another aspect, the present disclosure is directed to an antenna system comprising an antenna array having multiple antenna elements generating input signals successively 90 degrees out of phase such that the input signals have a relative phase of zero, 90, 180, and 270 degrees. The antenna system further comprises a transmission line connecting the antenna element at zero degrees to the antenna element at 90 degrees and another transmission line connecting the antenna element at 180 degrees to the antenna element at 270 degrees. Each transmission line may have a length that may generate a 90 degree phase shift thus aligning the phase of the input signal at zero degrees to the phase of the input signal at 90 degrees and aligning the phase of the input signal at 180 degrees to the phase of the input signal at 270 degrees. The antenna system further comprises a first transformer and a second transformer. The first transformer may receive signal from the 90 degree antenna element and output a signal having no phase adjustment. The second transformer may receive signal from the 270 degree antenna element and output a signal having a 180 degree phase adjustment such that the phase of the output signal of the second transformer may align with the phase of the first transformer output. The first and second transformers may couple together such that the outputs of each transformer may be phase aligned and a combined output signal may be generated. The combined output signal may be a RHCP signal as LHCP signals may be canceled. In some embodiments, turns ratio of the first and second transformers may control for a target resistance. The antenna system may include the prior antenna system configurations described herein having antenna elements at zero, 90, 180, and 270 degree positions.

In another aspect, the present disclosure is directed to a multi-band navigation signal antenna system comprising a single antenna supplying signals to a plurality of GNSS receiver modules. Such a multi-band navigation signal antenna system may be or include aspects of the other antenna systems described herein. In some embodiments, the multi-band navigation signal antenna system may include satellite navigation receiver modules covering the L1, L2, and L5 bands.

Various other aspects, details, and other are described subsequently herein.

It is noted that as used herein, the term, "exemplary" means "serving as an example, instance, or illustration." Any aspect, detail, function, implementation, and/or embodiment described herein as "exemplary" is not necessarily to be construed as preferred or advantageous over other aspects and/or embodiments.

EXAMPLE EMBODIMENTS

Figure 2A:
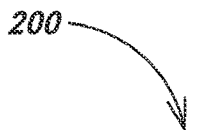
FIG. 2A is an isometric view of an antenna system embodiment.
Figure 2A:
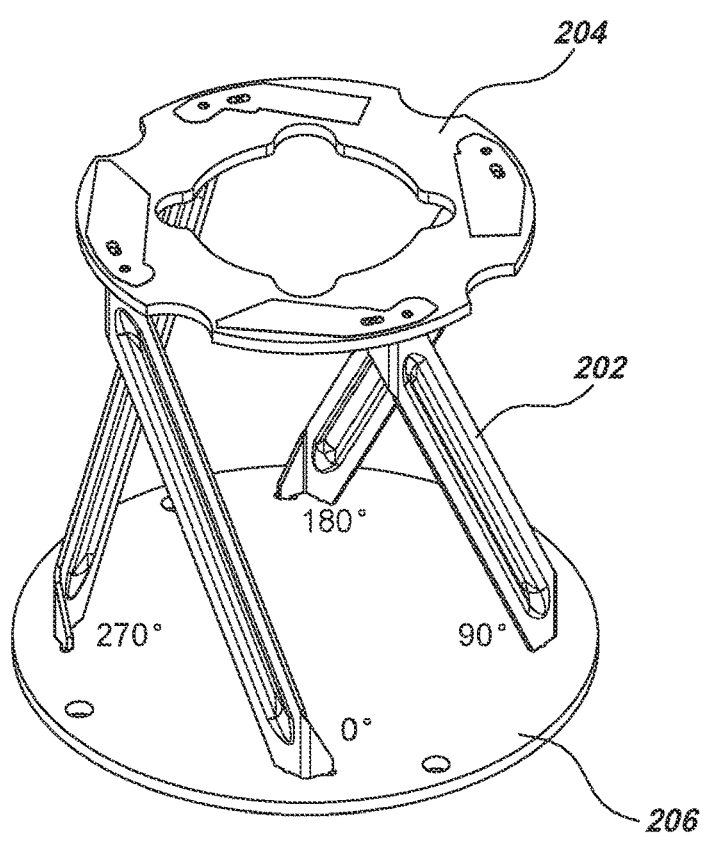
Figure 2B:
FIG. 2B is a side view of the antenna system embodiment of FIG. 2A.
Figure 2B:
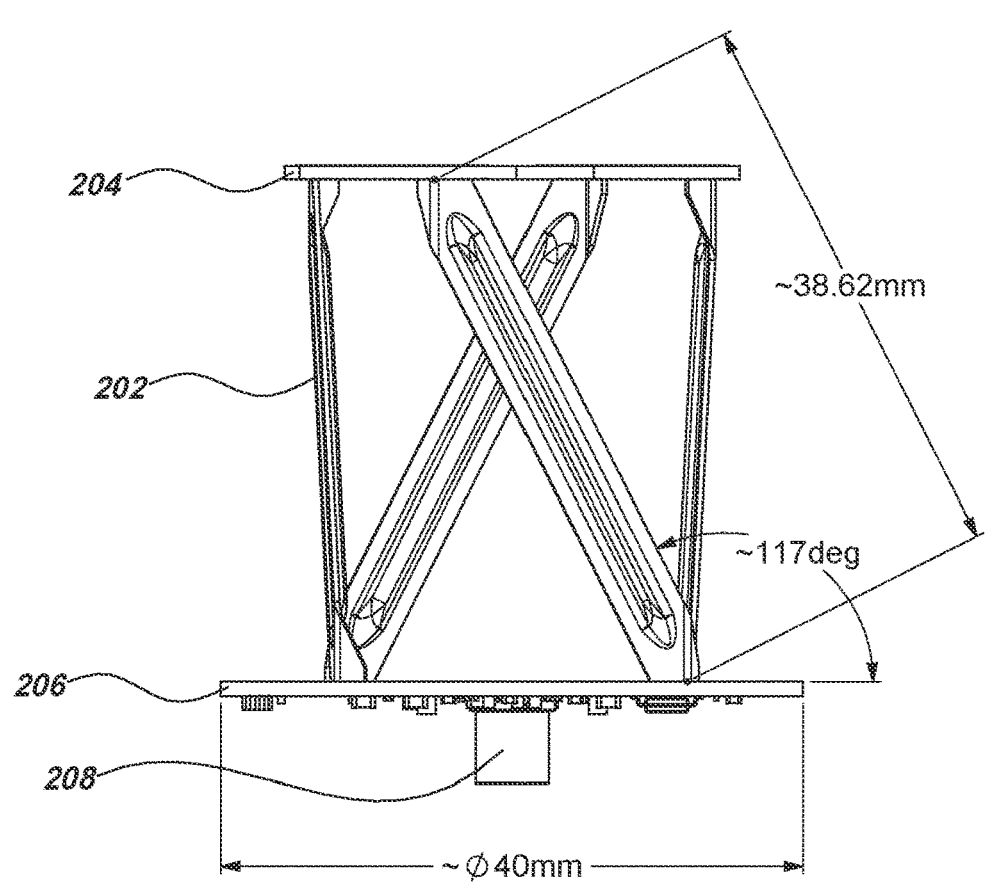
Figure 2C:
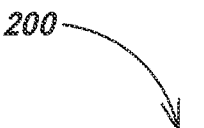
FIG. 2C is an exploded view of the antenna system embodiment of FIG. 2A.
Figure 2C:
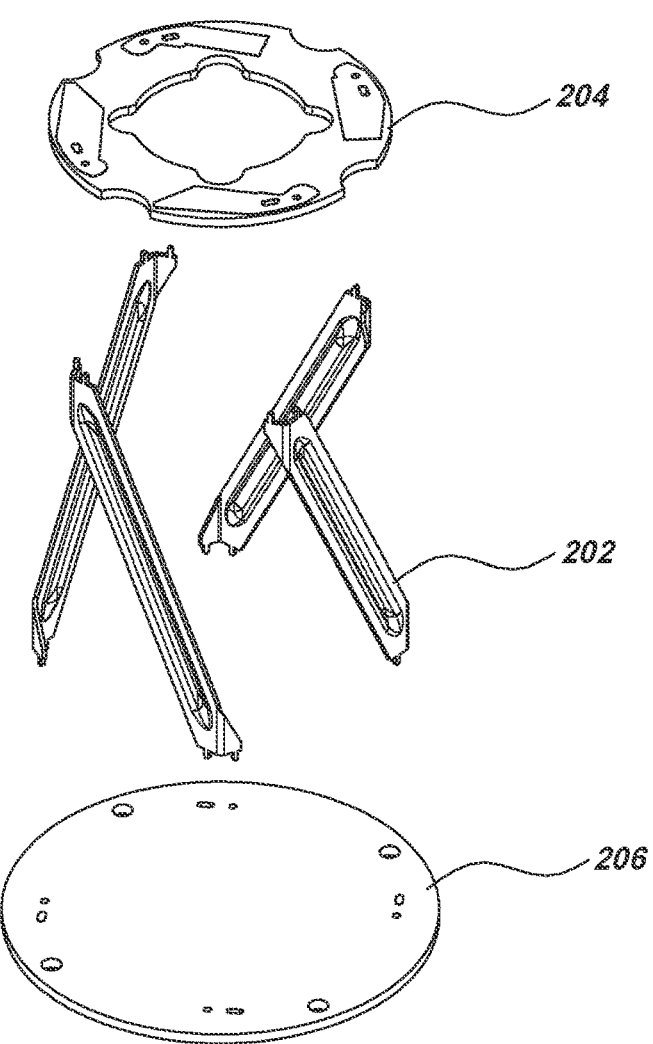
Figure 3A:
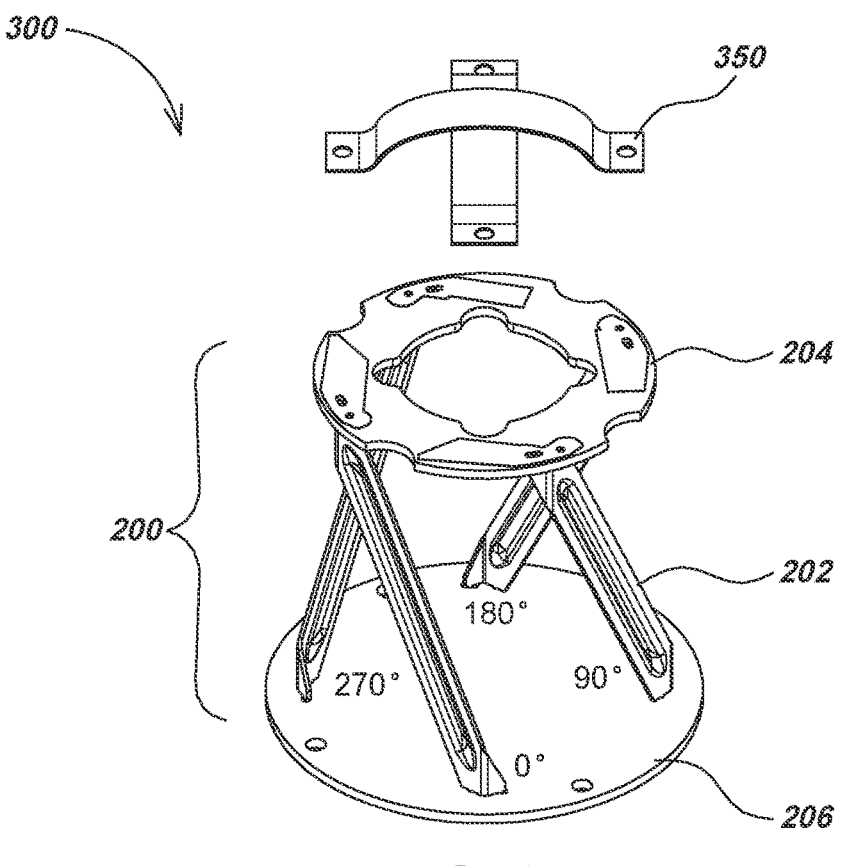
FIG. 3A is an exploded view of an antenna system embodiment including a top connector element.
Figure 3B:
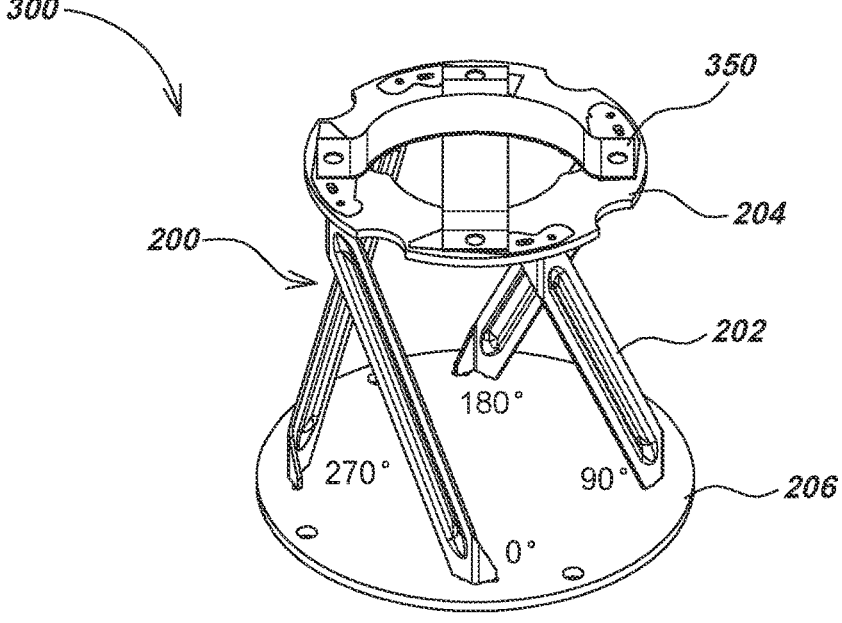
FIG. 3B is an isometric view of an antenna system embodiment including a top connector element.
Figure 4A:
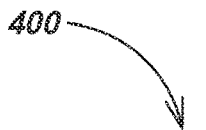
FIG. 4A is an isometric view of another antenna system embodiment.
Figure 4A:
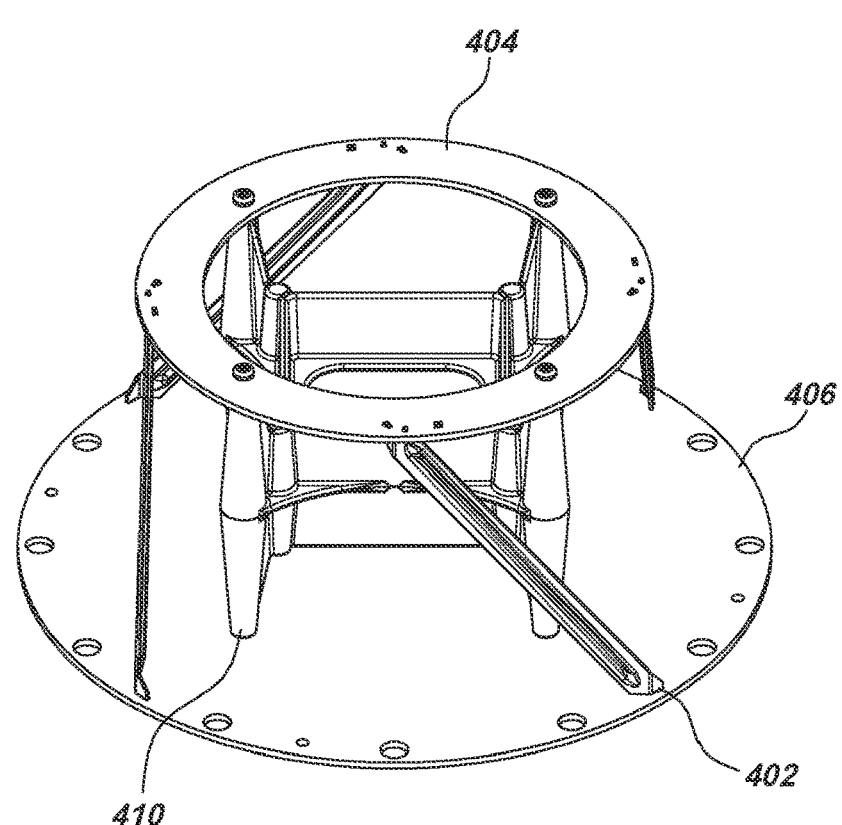
Figure 4B:
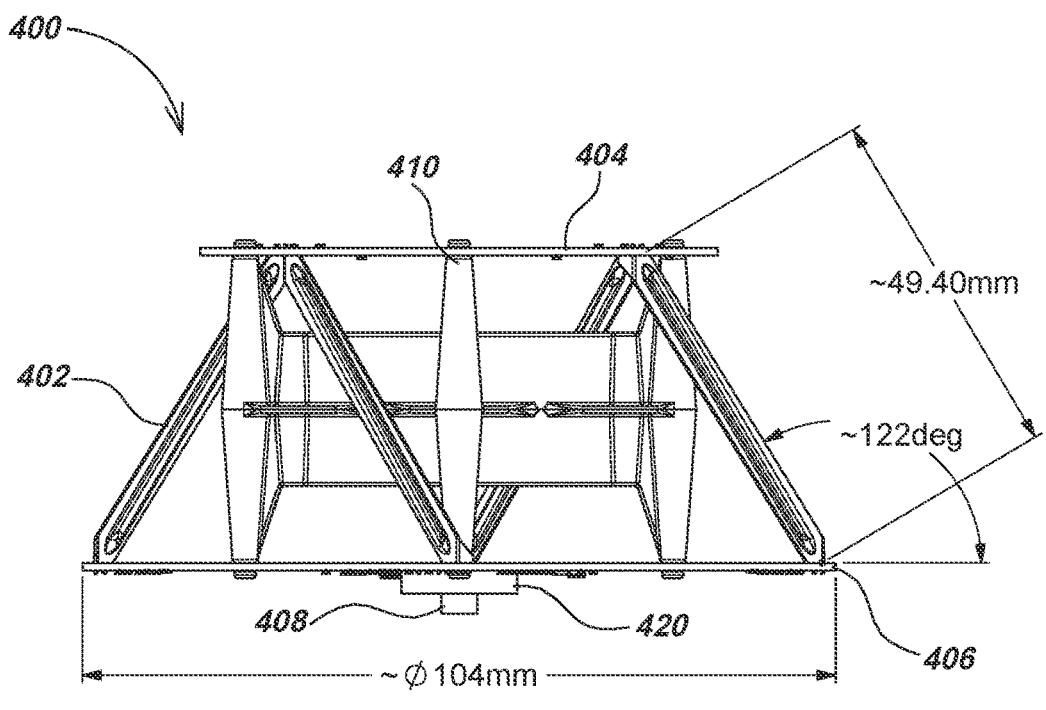
FIG. 4B is a side view of the antenna system embodiment of FIG. 4A.
Figure 4C:
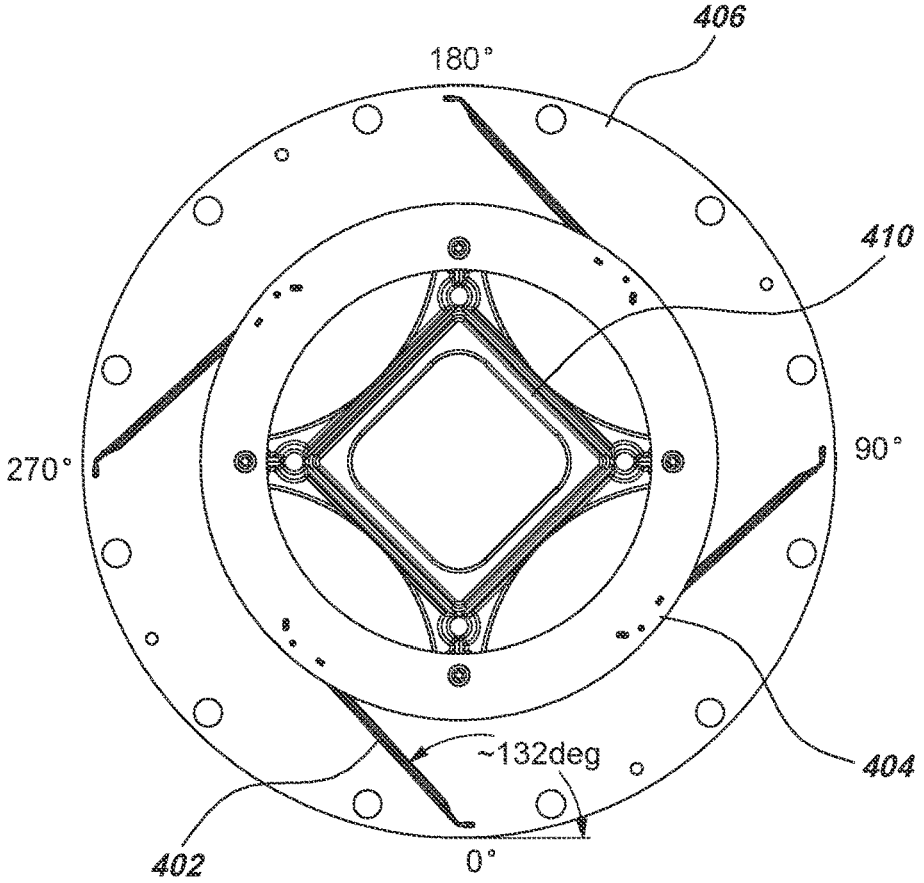
FIG. 4C is a top view of the antenna system embodiment of FIG. 4A.
Figure 4D:
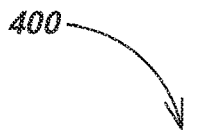
FIG. 4D is an exploded view of the antenna system embodiment of FIG. 4A.
Figure 4D:
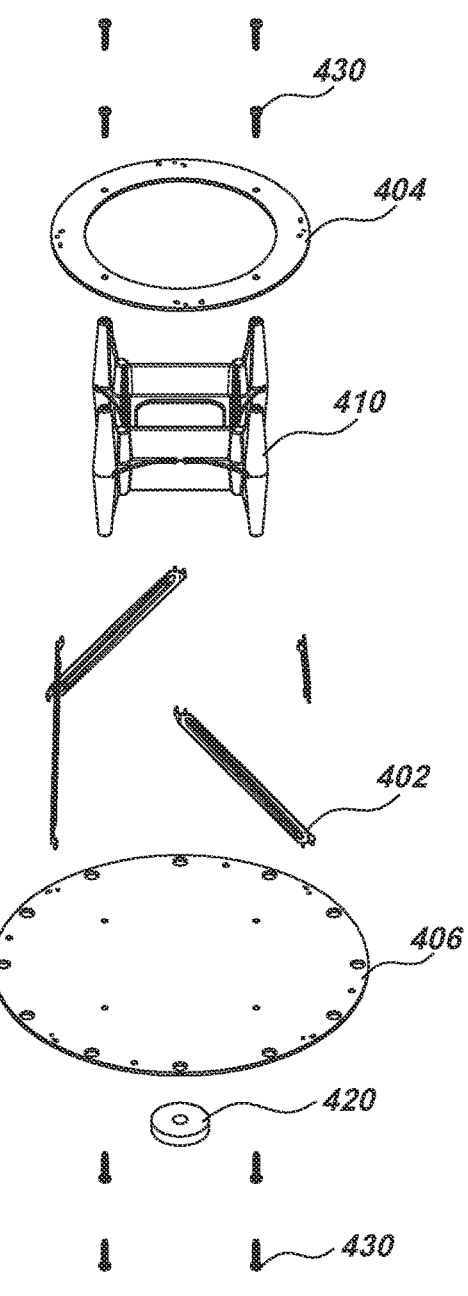
Figure 5A:
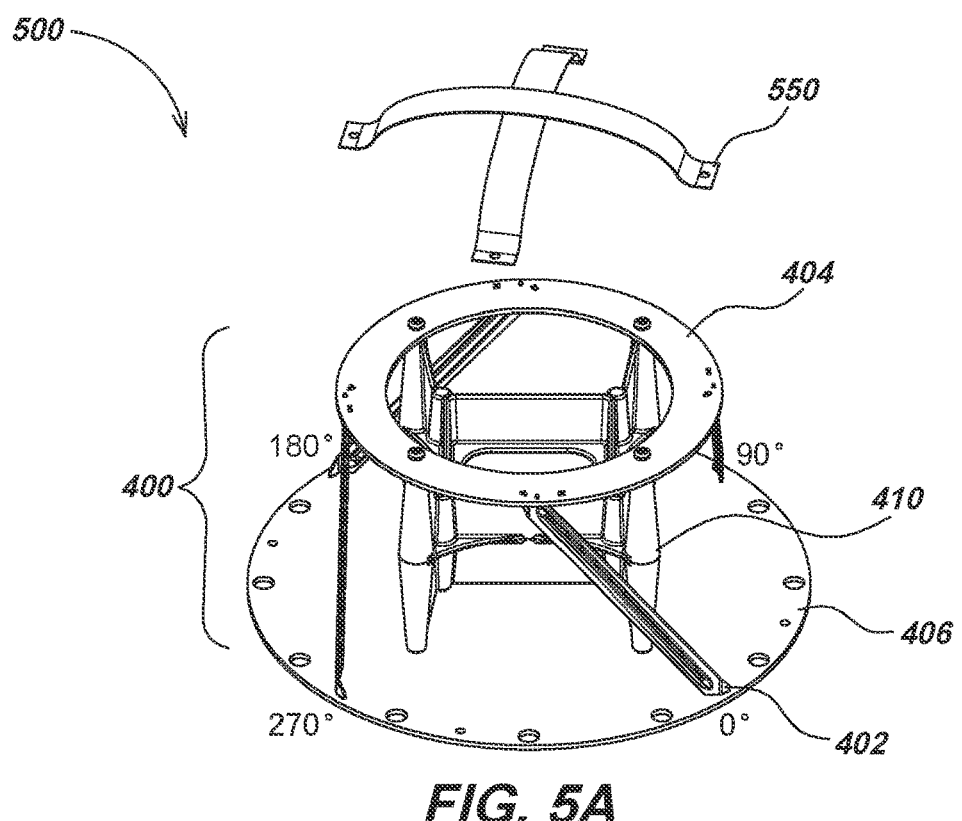
FIG. 5A is an exploded view of another antenna system embodiment including a top connector element.
Figure 5B:
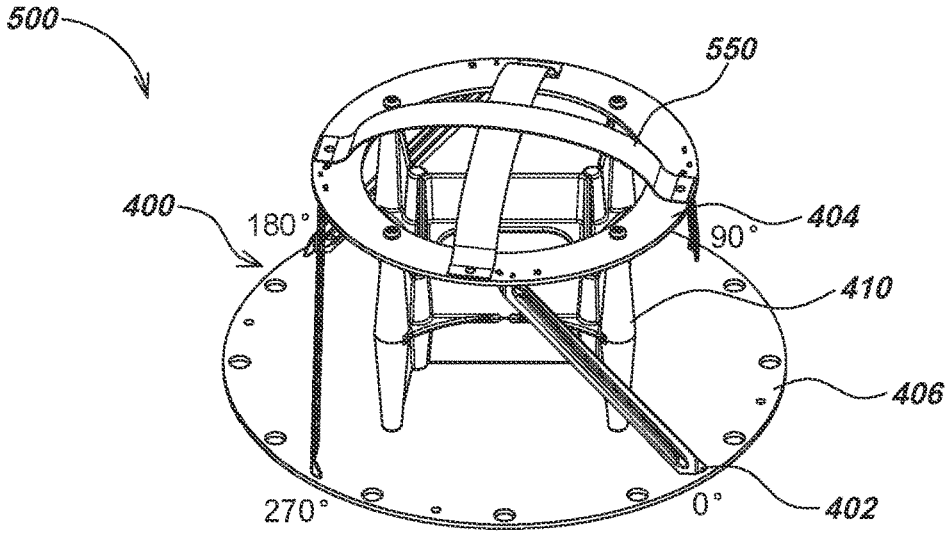
FIG. 5B is an isometric view of an antenna system embodiment including a top connector element.
Figure 7:
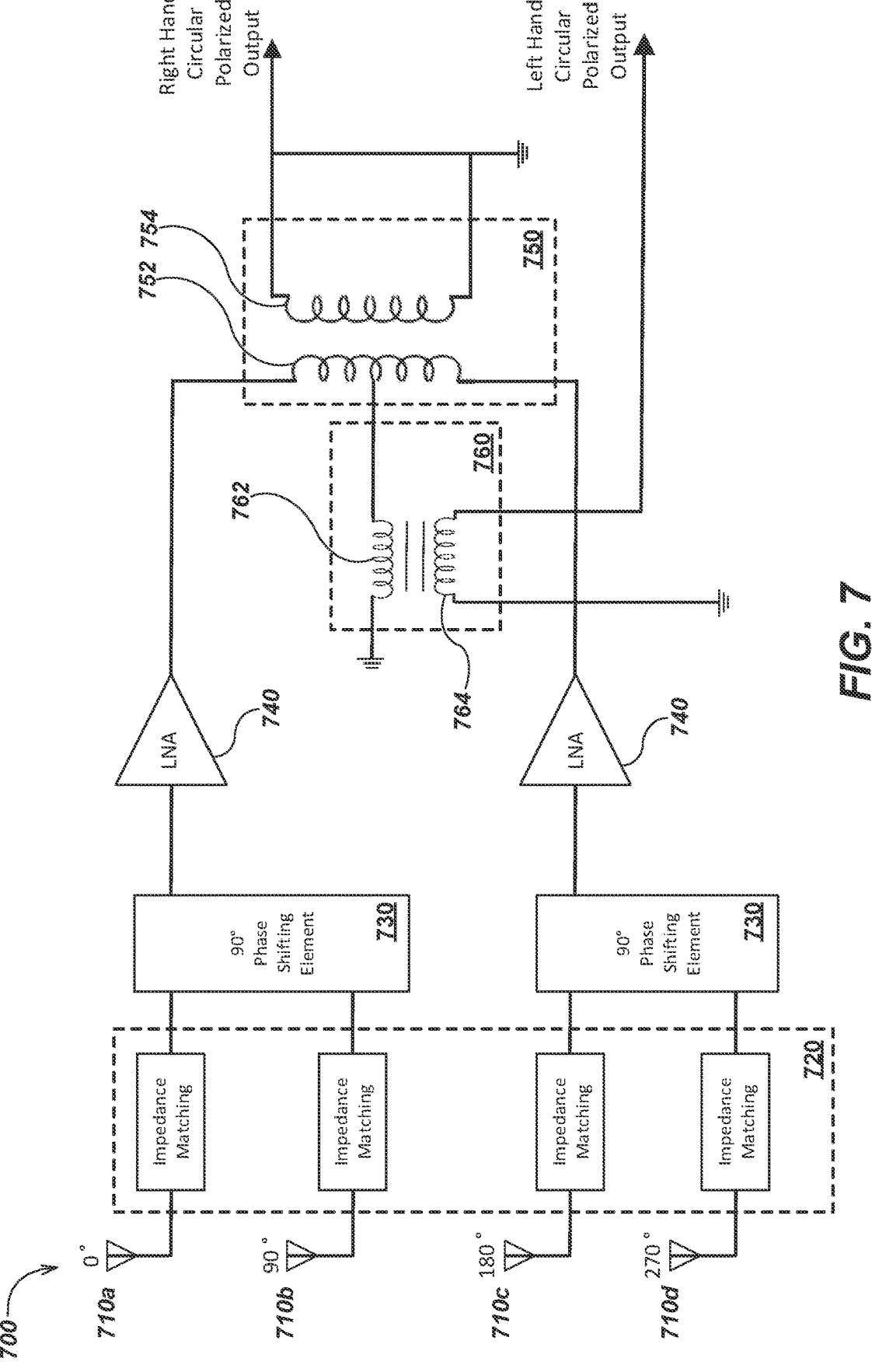
FIG. 7 is a circuit diagram of an antenna system embodiment.
Figure 9:
FIG. 9 is a circuit diagram of another antenna system embodiment.
Figure 10:
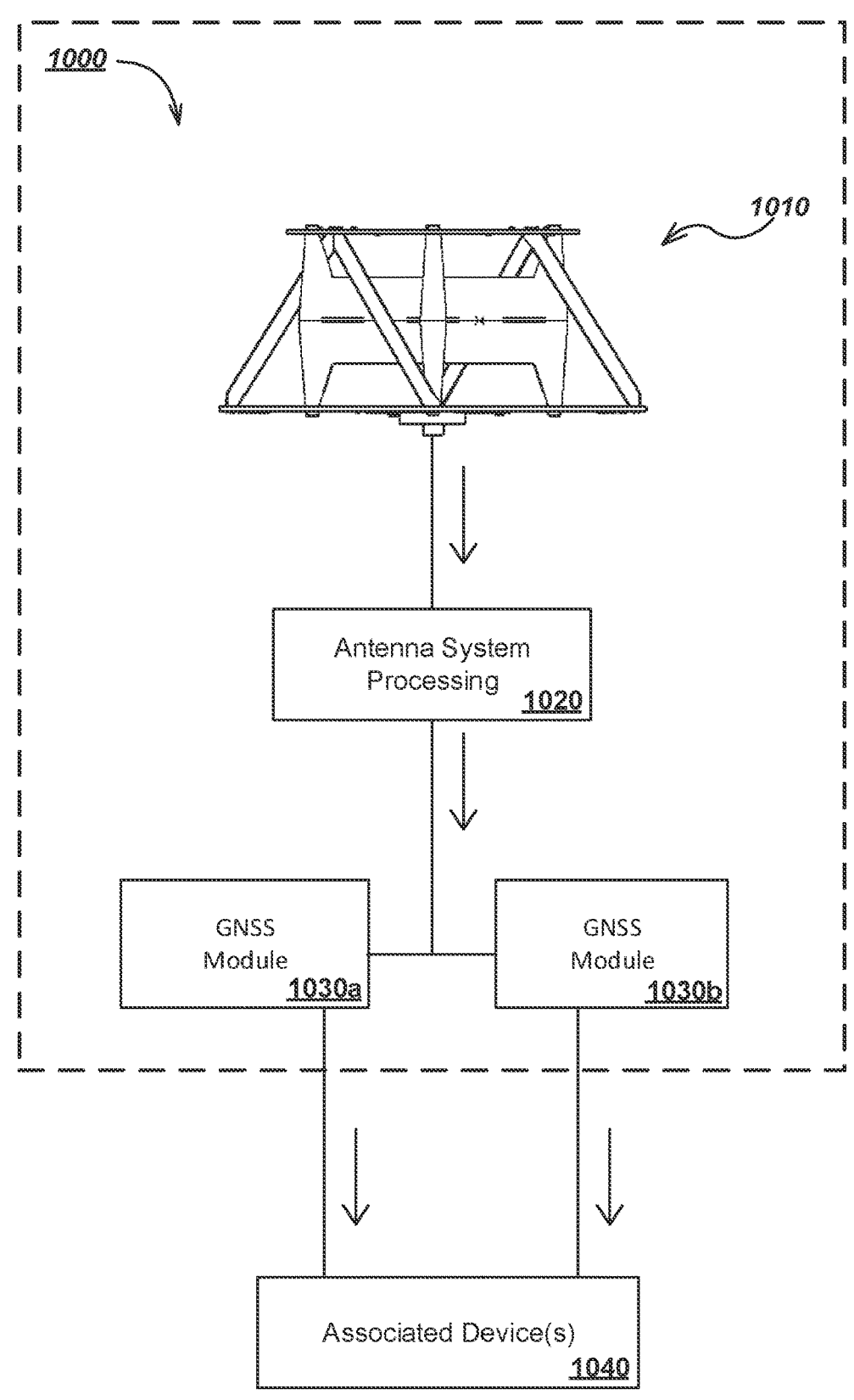
FIG. 10 is a diagram of a multi-band navigation signal antenna system [00031] embodiment.

Referring to FIG. 1, an antenna system embodiment 100 is illustrated which may be or include aspects of the antenna systems in accordance with the present disclosure such as, for example, antenna system 200 of FIGS. 2A-2C, antenna system 300 of FIGS. 3A-3B, antenna system 400 of FIGS. 4A-4D, antenna system 500 of FIGS. 5A-5B, antenna system 700 of FIG. 7, antenna system 900 of FIG. 9, multi-band satellite navigation antenna system 1000 of FIG. 10, or other similar systems not explicitly shown herein.

Antenna system 100 may be used to receive circularly polarized signals, such as right-hand circularly polarized (RHCP) signals 110a, which may be transmitted by one or more navigation system satellites 120 such as GPS, GLO-NASS, BEIDOU, GALILEO, and the like. Antenna system 100 may also be used for other applications where circularly polarized signals are used.

In some environments, the RHCP signals 110a may reflect or refract off surfaces or structures, resulting in a multipath signal which may be left-hand circularly polarized (LHCP), such as LHCP signal 110b. Likewise, antenna system 100 may receive LHCP signal 110b which may be subject to various multipath effects such as changes in phase, amplitude, timing delays, and the like.

Antenna system embodiment 100 may include an antenna array comprising a series of elongate conductive antenna elements 102 disposed in between a top PCB 104 and a ground plane 106 such as shown in FIG. 1. The ground plane 106 may be largely oriented to be parallel to a physical ground surface during normal usage. The antenna elements 102 may be positioned at relative zero, 90, 180, and 270 degree increments radially about a shared center point on ground plane 106. Each antenna element 102 may slope upward in a left-handed direction (when viewed side on as in FIG. 1) from ground plane 106 connecting between ground plane 106 and sloped toward the top PCB 104. The relative configuration of antenna elements 102, top PCB 104, and ground plane 106 may control the beam width, bandwidth, and ratio of RHCP and LHCP signals received at antenna system.

For example, in antenna system 100, the ground plane 106 may be a PCB that is circular in form or, in other embodiments, some other form such as square, oval, rectangular, or other shapes, and be greater in dimensional size relative to the wavelength of a received signal or range of signals. Likewise, the slope and length of each antenna element 102 may be determined relative to a received signal or range of signals and may, in other embodiments, be adjusted so as to adjust the target bandwidth of the antenna system.

The antenna system 100 and connected GNSS receiver module and associated device 130, for example, may be configured for receiving and processing a frequency range spanning the lower L-band GNSS navigational frequencies (e.g., the L5 and L2 bands) and/or upper L-band GNSS navigational frequencies (e.g., the L1 band). Furthermore, the slope and length of the antenna elements 102 and ground plane 106 dimensions may control the ratio of LHCP to RHCP signals.

For example, in some embodiments there may be a preference for RHCP signals or predominantly RHCP signals versus LHCP signals as expressed through the left-handed slope orientation of antenna elements 102. In the various embodiments described herein, exemplary measurements are described to provide examples of some antenna system configurations. However, it should be noted that the measurements, relative dimensions, and other parameters provided herein may be adjusted for beam width control, RHCP/LHCP ratio of signals, and bandwidth.

In some embodiments, an antenna system in accordance with aspects of the present disclosure may further include a top connector element electrically connecting the antenna elements at zero and 180 degrees, and the antenna elements at 90 and 270 degrees, along the tops of each antenna element, to adjust impedance of the antenna system.

Referring to FIGS. 2A-2C, an antenna system 200 in accordance with aspects of the present disclosure is illustrated having an antenna array comprising a series of conductive antenna elements 202 disposed in between a top PCB 204 and a ground plane 206 and angled between the ground plane and top PCB as shown. In assembly, the antenna elements 202 may be soldered in place on top PCB 204 and the ground plane 206, and the antenna elements 202 may provide the structure to hold the top PCB 204 in place at a distance relative to the ground plane 206.

As best shown in FIG. 2A, the antenna elements 202 may be positioned at relative zero, 90, 180, and 270 degree increments radially about a shared center point on ground plane 206. Each antenna element 202 may slope upward in a left-handed direction from ground plane 206 connecting between ground plane 206 and slope toward the top PCB 204. Adjustment of the relative configuration of antenna elements 202, top PCB 204, and ground plane 206 may be done to control the beam width, bandwidth, and ratio of RHCP and LHCP signals received at antenna system 200. The antenna elements may, as shown in FIG. 2A, be elongate conductive element such as metallic elements or other conductors. In some embodiments the elongate elements may be wire (not shown). In an exemplary embodiment the antenna elements are elongate stamped sheet metal elements as shown and may include stamped structural portions such as shown in FIG. 2A to provide additional strength along the length of the antenna elements.

In an exemplary embodiment, antenna system 200, as illustrated in FIG. 2B, may have antenna elements that are approximately 38.62 mm in length that have a slope angle of approximately 117 degrees in a vertical plane from the ground plane 206 to the top PCB 204 as seen from the side view of FIG. 2A. The ground plane 206 may be a PCB that is round in shape having a diameter of approximately 40 mm. The antenna system 200 may have a frequency range spanning the lower L-band GNSS navigational frequencies (e.g., the L5 and L2 bands) and upper L-band GNSS navigational frequencies (e.g., the L1 band) wherein the ratio of RHCP to LHCP signals may be predominately RHCP signals. Example tolerance from these dimensions would be+/–five percent, ten percent, twenty percent, and fifty percent from the length and angular dimensions for this embodiment. The antenna system 200 may further include one or more output terminals, such as terminal 208 (FIG. 2B) to communicate received signals to one or more GNSS modules or like signal processor(s).

In some embodiments, an antenna system in accordance with aspects of the present disclosure may further include a top connector element electrically connecting antenna elements at zero and 180 degrees and the antenna elements at 90 and 270 degrees along the tops of each antenna element.

As illustrated is FIGS. 3A and 3B, an antenna system embodiment 300 may include the antenna system 200 of FIGS. 2A-2C with the addition of a top connector element 350. The top connector element 350 may electrically connect antenna elements 202 at zero and 180 degrees and the antenna elements 202 at 90 and 270 degrees to top PCB 204. The top connector element 350 may be a flex circuit that may solder or otherwise secure to the top PCB 204 at opposite antenna elements 202. Top connector element 350 may form a catenary arc across top PCB 204, as in FIGS. 3A and 3B. In other embodiments, the top connector element may include or be of other materials or combination of materials formed into other shapes connecting oppositely positioned antenna elements.

Turning to FIGS. 4A-4D, an antenna system embodiment 400 is illustrated having an antenna array comprising a series of conductive antenna elements 402 disposed in between a top PCB 404 and a ground plane 406 as well as a terminal 408 (FIG. 4B) to communicate received signals to one or more GNSS modules or like signal processor(s). An optional gasket 420 (FIGS. 4B and 4D) may sit about the terminal 408 (FIG. 4B) to prevent damage to components that may contact the terminal 408 (FIG. 4B) or ground plane 406 such as the ferrite element 630 (FIG. 6B) which may sit about a portion of a cable 630 (FIG. 6B). Antenna system 400 may further include a support element 410 to support the top PCB 404 apart from the ground plane 406.

In assembly, as best illustrated in FIG. 4D, the top PCB 404 may secure to the support element 410 via screws 430 on one end, and the ground plane 406 may secure to the support element 410 on the other. Antenna system 400 may be soldered in place on the top of PCB 404 and ground plane 406.

As best illustrated in FIG. 4C, the antenna elements 402 may be positioned at relative zero, 90, 180, and 270 degree increments radially about a shared center point on ground plane 406. Each antenna element 402 may slope upward in a left-handed direction from ground plane 406 connecting between ground plane 406 and the top PCB 404. The antenna element 402 of antenna system 400 may further have an inward slope from the ground plane 406 towards the smaller diameter top PCB 404. The configuration of antenna elements 402, top PCB 404, and ground plane 406 may control the beam width, bandwidth, and ratio of RHCP and LHCP signals received at antenna system 400.

Antenna system embodiment 400, as illustrated in FIG. 4B, may have antenna elements that are each approximately 49.40 mm in length that have an approximate slope angle of 122 degrees in a vertical plane from the ground plane 206 to top PCB 404. Each antenna element may further have an inward slope angle (FIG. 4C) measuring approximately 132 degrees in the horizontal plane from the edge of the ground plane 206 toward the top PCB 404. The ground plane 406 may be a PCB that is round in shape having a diameter of approximately 100 mm. Example tolerance from these dimensions would be+/–five percent, ten percent, twenty percent, and fifty percent from the length and angular dimensions for this embodiment. The antenna system 400 may have a frequency range spanning the lower L-band GNSS navigational frequencies (e.g., the L5 and L2 bands) and upper L-band GNSS navigational frequencies (e.g., the L1 band) wherein the ratio of RHCP to LHCP signals may be predominately RHCP signals.

Turning to FIGS. 5A and 5B, an antenna system embodiment 500 may include the antenna system 400 of FIGS. 4A-4D with the addition of a top connector element 550. The top connector element 550 electrically connects antenna elements 402 at zero and 180 degrees and the antenna elements 402 at 90 and 270 degrees. The top connector element 550 may be a flex circuit that may secure to the top PCB 404 via solder or the like. In other embodiments other materials or combinations of materials may be used to electrically connect oppositely positioned antenna elements.

The antenna systems described herein may be disposed into a housing element or otherwise encapsulated through overmolding or like processes to protect the antenna system against the external environment.

Figure 6A:
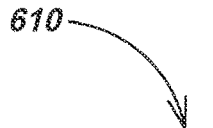
FIG. 6A is an isometric view of an antenna system embodiment disposed in a housing.
Figure 6A:
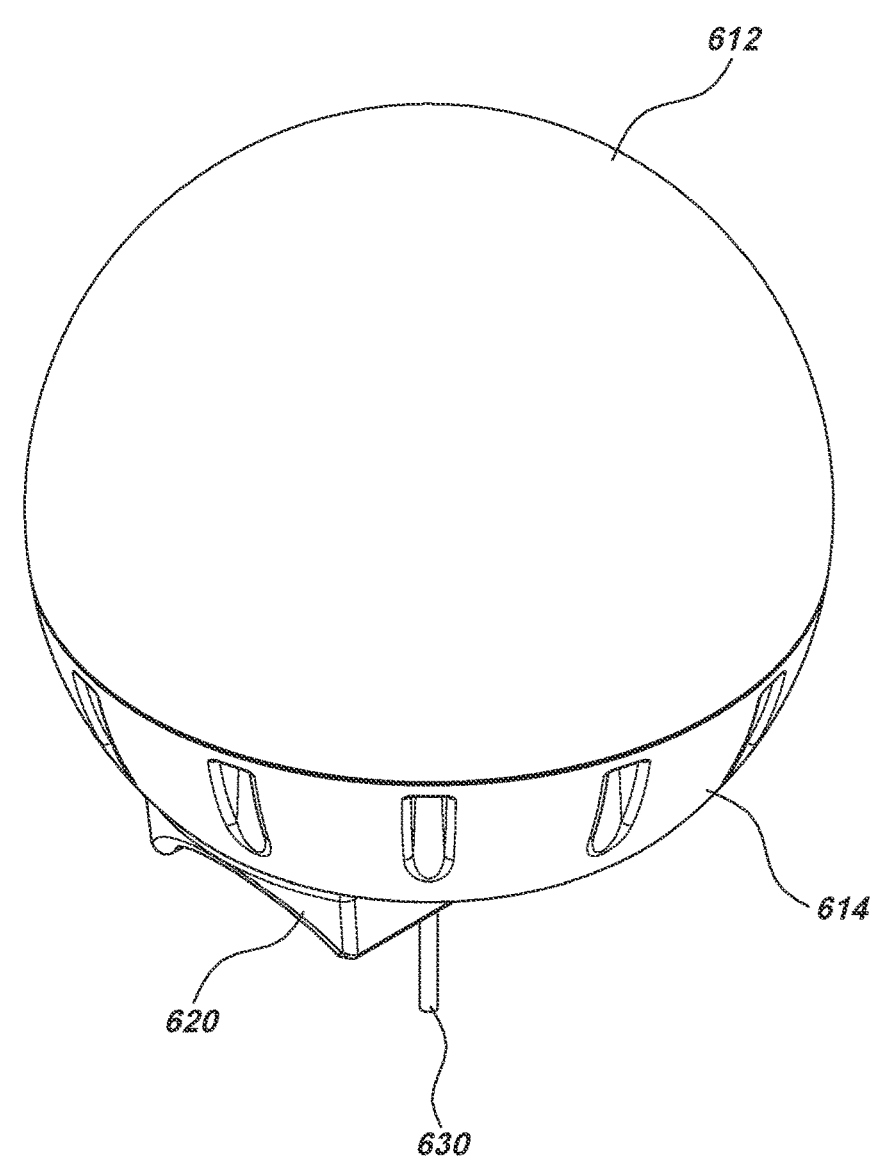
Figure 6B:
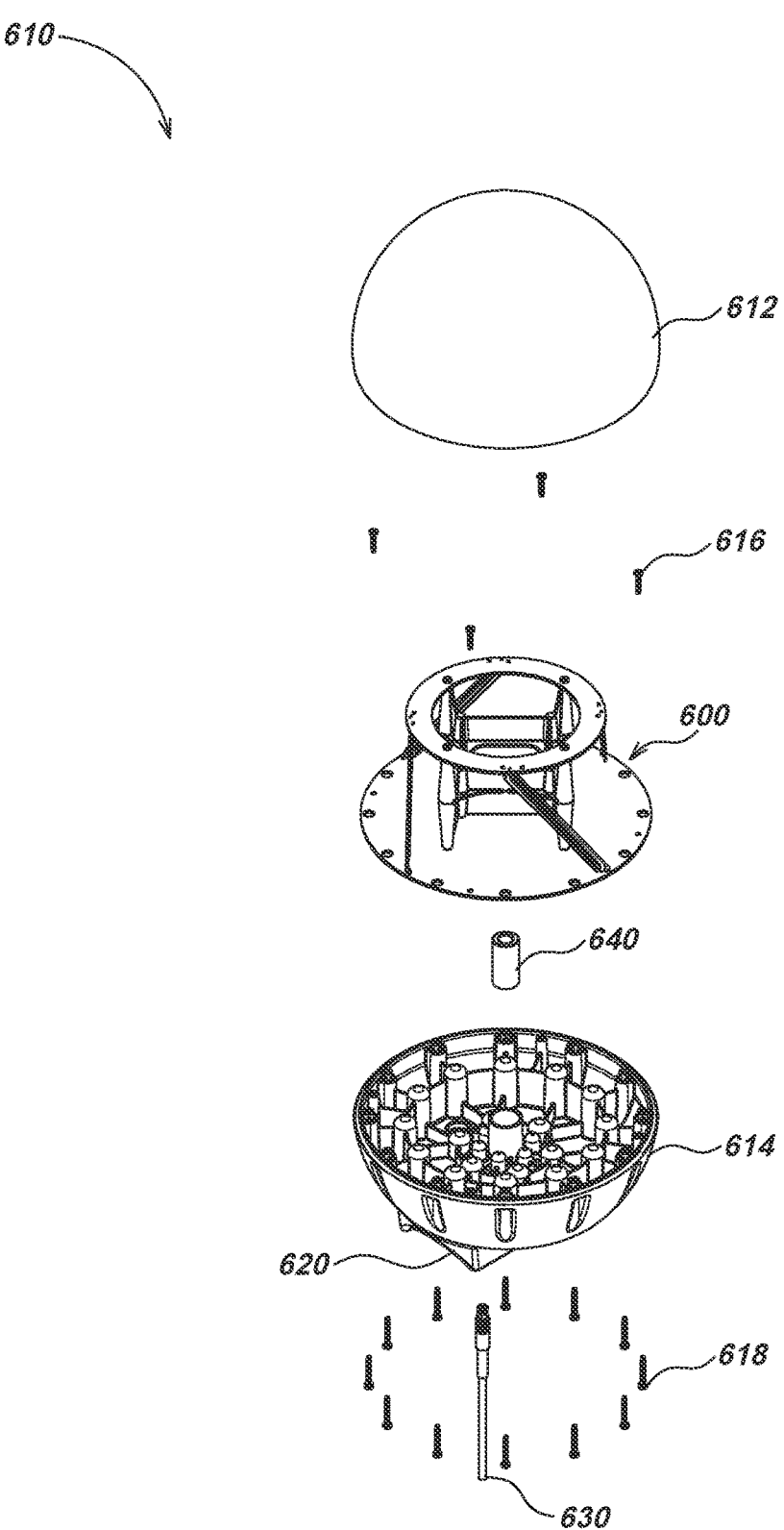
FIG. 6B is an exploded view of the antenna system and housing embodiment of FIG. 6A.

As illustrated in FIGS. 6A and 6B, an antenna system embodiment 600 (FIG. 6B), which may be or share aspects with the antenna system 400 of FIGS. 4A-4D, may be disposed in a housing 610. The housing 610 may include a top housing 612 and bottom housing 614 that may mate together in assembly enclosing the antenna system 600 (FIG. 6B) therein.

Referring to FIG. 6B, the antenna system 600 may secure to the bottom housing 614 via screws 616. The top housing 612 and bottom housing 614 of housing 610 may secure together via screws 618 or, in other embodiments, through adhesives or interlocking pieces, or other ways to couple bottom and top housing together may be used. The housing 610 may further include a mounting bracket 620 that may allow housing 610 and antenna system 600 to be mounted such that the ground plane of the antenna system 600 may be largely parallel to the ground surface. A cable 630 may couple to the antenna system 600 internal to housing 610 and pass through it to the outside of housing 610 allowing the antenna system 600 to electrically connect to an external device for signal processing. An optional ferrite element 640 may sit about a portion of the cable 630 connecting to antenna 600 to prevent communicated signals from coupling back at antenna elements thereon.

Turning to FIG. 7, a circuit diagram of an antenna system embodiment 700 in accordance with aspects of the present disclosure is illustrated. The antenna system 700 may use input from four separate antennas 710a, 710b, 710c, and 710d that are each successively 90 degrees out of phase from one another. For instance, the antenna system 200 of FIGS.

2A-2C, antenna system 300 of FIGS. 3A and 3B, antenna system 400 of FIGS. 4A-4D, and antenna system 500 of FIGS. 5A and 5B, having antenna elements positioned at 90 degree increments about a shared center point on a ground plane, may produce input signals successively 90 degrees out of phase. The input signals from antennas 710*a*, 710*b*, 710*c*, and 710*d* may be communicated to an impedance matching network 720 ensuring matching of impedances across the four input signals. Pairing of impedance matched input signals for two contiguous 90 degree out of phase signals are formed such that there are two pairs of signals and each pair may be communicated to a different 90 degree phase shifting element.

Figure 8:
FIG. 8 is a diagram of a 90 degree phase shifting element embodiment.
Figure 8:
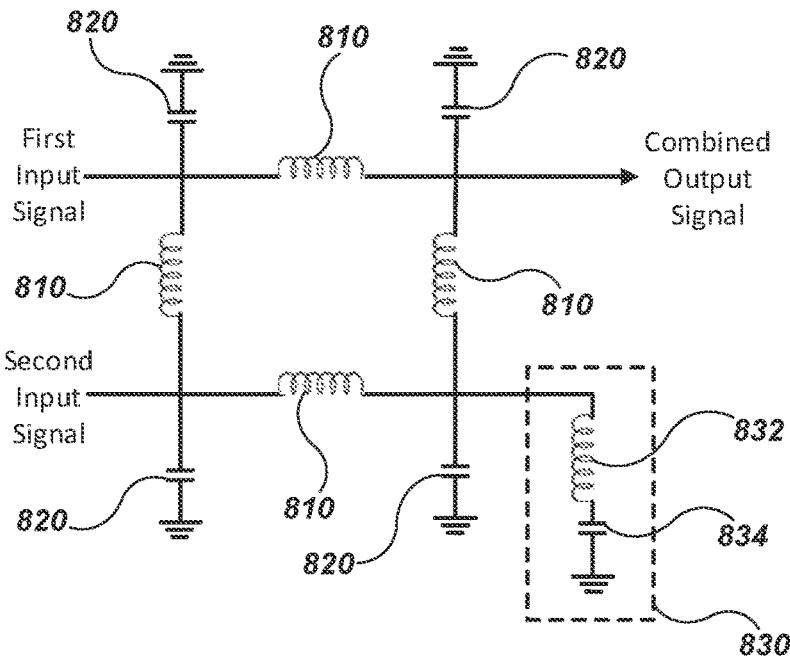

For example, the impedance matched input signals from the impedance matching network 720 of antennas 710*a* and 710*b* at zero and 90 degrees may be paired, and the impedance matched input signals from the impedance matching network 720 of antennas 710*c* and 710*c* at 180 and 270 degrees may be paired. Input signals from each pair may be communicated to a separate 90 degree phase shifting element 730. The 90 degree phase shifting element 730 may have two inputs, a first input signal and a second input signal to receive inputs from 2 antenna pairs (e.g., antennas 710*a* and 710*b* or antennas 710*c* and 710*d*). Each 90 degree phase shifting element 730 may have two outputs, as seen in FIG. 8. One of the two outputs may generate a combined output signal wherein the phase of one input signal is adjusted to align to that of the other input signal. For instance, the phase of the second input signal may be adjusted by 90 degrees to match that of the first input signal. It should be noted that the combined output signal of one 90 degree phase shifting element 730 may be 180 degrees out of phase to the combined output signal of the other 90 degree phase shifting element 730.

In some embodiments, the 90 degree phase shifting element may have the topology of the 90 degree phase shifting element 800 of FIG. 8 allowing for an increased bandwidth range. Some such embodiments may have a bandwidth ranging the lower L-band GNSS navigational frequencies (e.g., the L5 and L2 bands) and upper L-band GNSS navigational frequencies (e.g., the L1 band). The 90 degree phase shifting element 800 may include four inductors 810; two in series with the input signals and two in parallel on either side of the in series inductors 810. A tap to ground having a capacitor 820 may exist at the intersection on lines between the parallel and series wired inductors 810. The second output 830, which may be unused in the diagram of antenna system 700 of FIG. 7, may have another inductor 832 and capacitor 834 wired in series to ground.

Referring back to FIG. 7, a low noise amplifier (LNA) 740 may be coupled to each 90 degree phase shifting element to amplify the combined output signal and isolate impedance differences in the two 180 degree out of phase combined output signals. The antenna system 700 may further include a first transformer element 750 comprising a first inductor 752 coupled to both LNAs 740 that outputs RHCP signals at a second inductor 754. The antenna system 700 may further include a second transformer element 760 comprising a first inductor 762 coupled between ground and the first inductor 752 of the first transformer element 750 such that first inductor 762 of the second transformer element 760 may be center tapped off the first inductor 752 of the first transformer element 750. The first inductor 762 may take common mode signals and outputs LHCP signals at a second inductor 764. The loading of LHCP signals at the second transformer element 760 may enhance the RHCP signals at the first transformer element 750 and thereby performance of antenna system 700. The RHCP output signals may further be communicated to one or more GNSS receiver modules such as those described with the multi-band satellite navigation antenna system 1000 of FIG. 10.

Turning to FIG. 9, a circuit diagram of another antenna system embodiment 900 in accordance with aspects of the present disclosure is illustrated. The antenna system 900 may use input from four separate antennas 910*a*, 910*b*, 910*c*, and 910*d* that are each successively 90 degrees out of phase from one another. For instance, the antenna system 200 of FIGS. 2A-2C, antenna system 300 of FIGS. 3A and 3B, antenna system 400 of FIGS. 4A-4D, and antenna system 500 of FIGS. 5A and 5B, having antenna elements positioned at 90 degree increments about a shared center point on a ground plane, may produce input signals successively 90 degrees out of phase.

In the antenna system 900 of FIG. 9, the antenna 910*a* may, for example, be at a relative zero degrees, the antenna 910*b* may be at 90 degrees, the antenna 910*c* may be at 180 degrees, and antenna 910*d* may be at 270 degrees. Antenna 910*a* may connect to antenna 910*b* and antenna 910*c* may connect to antenna 910*d* each by a transmission line 920 having a length causing a 90 degree phase shift thus allowing for the phase of signal received at antenna 910*a* to align to the phase of signal at antenna 910*b* and the phase of signal received at antenna 910*c* to align to the phase of signal at antenna 910*d*. It should be noted that phases of signals at antennas 910*b* and 910*d* will be 180 degrees out of phase from one another. From antenna 910*b*, signal may be transmitted to a first transformer 930*a*. No phase shift may occur at the output of transformer 930*a*. From antenna 910*d*, signal may be transmitted to a second transformer 930*b* wherein a 180 phase shift may occur at the output. As the 180 degree phase shift from the second transformer 930*b* output may align with the output of the first transformer 930*a*, the outputs may couple and generate a combined output signal. It should be noted that the turns ratio of the first transformer 930*a* and second transformer 930*b* may be adjusted to control resistance, minimize losses, and maximize the sensitivity of the antenna system 900.

In antenna system 900 of FIG. 9, incorrectly phased signals may be LHCP signals that may cancel leaving the correctly phased combined output signal to be a RHCP signal. The combined output signal may further be communicated to one or more GNSS receiver modules such as those described with the multi-band satellite navigation antenna system 1000 of FIG. 10.

Turning to FIG. 10, a multi-band satellite navigation antenna system embodiment 1000 in accordance with aspects of the present disclosure may include a single antenna, such as antenna 1010, to communicate GNSS signals to a plurality of GNSS receiver modules, such as GNSS modules 1030*a* and 1030*b*. The antenna 1010 may be the antenna system 200 of FIGS. 2A-2C, antenna system 300 of FIGS. 3A and 3B, antenna system 400 of FIGS. 4A-4D, or antenna 500 of FIGS. 5A and 5B. Some antenna system processing 1020 may occur from signal(s) received at antenna 1010. Such antenna system processing 1020 may include the signal processing circuitry found with antenna system 700 of FIG. 7 that may further include the 90 degree phase shifting element 800 of FIG. 8 or may include the signal processing circuitry found with antenna system 900 of FIG. 9. The output of the antenna system processing 1010 may further be communicated to a plurality of GNSS receiver modules such as GNSS modules 1030*a* and 1030*b*. In other embodiments, different numbers of GNSS receiver modules may be included. The different GNSS receiver modules, such as GNSS modules 1030*a* and 1030*b* may cover a range of different GNSS signal bands. In some embodiments, a multi-band satellite navigation antenna system may cover the L1, L2, and L5 bands. The GNSS modules 1030*a* and 1030*b* may communicate further processed GNSS related data to one or more associated devices 1040.

The scope of this disclosure is not intended to be limited to the aspects shown herein, but is to be accorded the full scope consistent with the specification and drawings as well as their equivalents, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

The previous description of the disclosed aspects is provided to enable any person skilled in the art to make or use embodiments of the present invention. Various modifications to these aspects will be readily apparent to those skilled in the art, and the generic principles defined herein may be applied to other aspects without departing from the spirit or scope of the invention. Thus, the presently claimed invention is not intended to be limited solely to the aspects shown herein but is to be accorded the widest scope consistent with the following claims and their equivalents.

We claim:

1. An antenna system, comprising:
an antenna array having multiple antenna elements generating input signals successively 90 degrees out of phase such that the input signals have a relative phase of zero, 90, 180, and 270 degrees, wherein the antenna array comprises four conductive elongate antenna elements
positioned at relative zero, 90, 180, and 270 degree increments radially about a shared center point on a printed circuit board (PCB), with each antenna element sloping upward in a left-handed direction from a ground plane towards the PCB and connected to the ground plane and the PCB.

2. The antenna system of claim 1, further comprising a transmission line connecting the antenna elements at zero degrees to the antenna element at 90 degrees wherein the length of the transmission line generates a 90 degree phase shift aligning the phase of the input signal at zero degrees to the phase of the input signal at 90 degrees;
a transmission line connecting the antenna elements at 180 degrees to the antenna element at 270 degrees wherein the length of the transmission line generates a 90 degree phase shift aligning the phase of the input signal at 180 degrees to the phase of the input signal at 270 degrees;
a first transformer to receive signal from the 90 degree antenna elements and output a signal having no phase adjustment;
a second transformer to receive signal from the 270 degree antenna elements and output a signal having an 180 degree phase adjustment that aligns with the phase of the first transformer output; and
a coupling of the first and second transformers such that their outputs generate a combined, phase aligned output signal.

3. The antenna system of claim 2, wherein the antenna array comprises four conductive elongate antenna elements positioned at relative zero, 90, 180, and 270 degree increments radially about a shared center point on the PCB, with each antenna element sloping upward in a left-handed direction from the ground plane towards the PCB and connected to the ground plane and PCB.

4. The antenna system of claim 2, wherein the turns ratio of the first and second transformers controls for a target resistance.

5. A multi-band navigation signal system, comprising:
a single antenna to receive satellite navigation signals; and two or more satellite navigation receiver modules to receive satellite signals of different bands wherein all receiver modules are coupled to the single antenna, wherein the antenna is the antenna system of claim 1.

6. The multi-band navigation signal system of claim 5, wherein the ground plane is circular.

7. The multi-band navigation signal system of claim 5, wherein the satellite navigation receiver modules include the L1, L2, and L5 bands.

8. An antenna system, comprising:
an antenna array having multiple antenna elements generating input signals successively 90 degrees out of phase such that the input signals have a relative phase of zero, 90, 180, and 270 degrees;
a pair of 90 degree phase shifting elements wherein each phase shifting element is coupled to a pair of antenna elements in the antenna array to receive their associate input signals, shift the phase on one signal 90 degree to match that of its paired antenna element's signal, and output a combined signal 180 degree out of phase to that of the output signal of the other 90 degree phase shifting element; and
a pair of low noise amplifiers, each coupled to a corresponding 90 degree phase shifting element to amplify the combined output signal of the corresponding phase shifting element and to isolate impedance differences the two 180 degree out of phase combined output signals.

9. The antenna system of claim 8, comprising: a first transformer element comprising a first inductor coupled to both low noise amplifiers that outputs right-hand circularly polarized signals at a second inductor, and a second transformer element comprising a first inductor and a second transformer wherein the first inductor is center tapped off the first inductor of the first transformer element and takes common mode signals and outputs left-hand circularly polarized signals at the second inductor.

10. The antenna system of claim 8, wherein the antenna array comprises four conductive elongate antenna elements positioned at relative zero, 90, 180, and 270 degree increments radially about a shared center point on a PCB, with each antenna element sloping upward in a left-handed direction from a ground plane towards the PCB and connected to the ground plane and the PCB.

11. The antenna system of claim 10, further including a top connector element of conductive material connecting the antenna elements at zero and 180 degrees and the antenna elements at 90 and 270 degrees along the PCB.

12. The antenna system of claim 10, wherein beam width control, bandwidth, and left-hand and right-hand signal ratio are adjusted based on a predefined slope angles and lengths of the antenna elements and dimensions of the ground plane.

13. The antenna system of claim 10, wherein the ground plane is circular in shape.

14. The antenna system of claim 10, wherein the PCB is circular in shape.

15. The antenna system of claim 10, further including an output terminal disposed on the ground plane.

16. The antenna system of claim 8, further comprising an impedance matching network coupled to the antenna array such that the impedance of the input signals at each antenna element matches that of the other antenna elements.

17. The antenna system of claim 8, wherein the antenna elements are elongate conductors each having a length of approximately 38.62 mm and a slope angle of approximately 117 degrees.

18. The antenna system of claim 8, wherein the antenna is tuned for a frequency range spanning the lower L-band and upper L-band Global Navigation Satellite System (GNSS) navigational frequencies.

* * * * *